United States Patent [19]

Sugino et al.

[11] 4,296,387
[45] Oct. 20, 1981

[54] SEMICONDUCTOR LASER

[75] Inventors: Takashi Sugino, Takatsuki; Kunio Itoh, Uji, both of Japan

[73] Assignee: Matsushita Electric Industrial Co., Ltd., Kadoma, Japan

[21] Appl. No.: 40,182

[22] Filed: May 18, 1979

[30] Foreign Application Priority Data

| May 22, 1978 | [JP] | Japan | 53-61205 |
| Jun. 7, 1978 | [JP] | Japan | 53-69362 |
| Jun. 7, 1978 | [JP] | Japan | 53-69363 |
| Jun. 7, 1978 | [JP] | Japan | 53-69364 |
| Jun. 8, 1978 | [JP] | Japan | 53-69572 |
| Dec. 18, 1978 | [JP] | Japan | 53-156621 |

[51] Int. Cl.$^3$ .............................................. H01S 3/19
[52] U.S. Cl. ............................................. 331/94.5 H
[58] Field of Search .................. 331/94.5 H; 357/17, 357/18

[56] References Cited

U.S. PATENT DOCUMENTS 4,185,256  1/1980  Scifres et al. .................. 331/94.5 H

OTHER PUBLICATIONS

D. Botez et al., "Constricted Double-Heterostructure (AlGa)As Diode Lasers", Appl. Phys. Lett. 32(4), Feb. 15, 1978, pp. 261-263.

Primary Examiner—James W. Davie
Attorney, Agent, or Firm—Cushman, Darby & Cushman

[57] ABSTRACT

In a semiconductor laser comprising an active layer epitaxially formed on a semiconductor substrate and at least a current limiting layer which defines a current injection region of a stripe shape,
the improvement is that said substrate has a terrace part on its principal face,
said active layer has two parallel bending parts defining a stripe shape active region facing said current injection region inbetween and
said stripe shape active region is disposed with a specified angle to said principal face.

10 Claims, 31 Drawing Figures

SEMICONDUCTOR LASER

BACKGROUND OF THE INVENTION

1. Field of Technology

The present invention relates to an improvement in a semiconductor laser and method of making the same. Especially the present invention relates to a semiconductor laser made by epitaxial growth method.

2. Prior Art

Hitherto various proposals on configuration and methods of making are made concerning semiconductor lasers for stable fundamental transverse mode operation. In general, the fundamental transverse operation can be obtained by making width of stripe shaped active region narrow thereby confining only a lowest mode light in the narrow stripe shaped active region.

Figure 1:
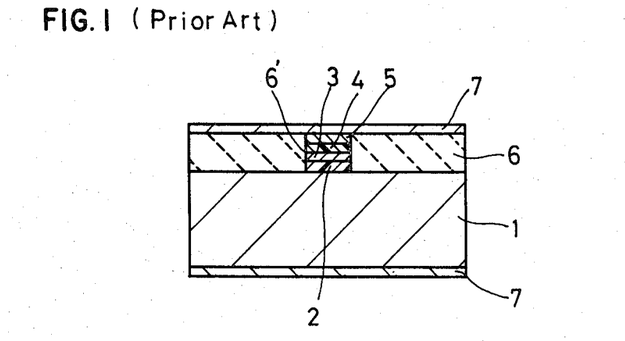
FIG. 1, FIG. 2 and FIG. 3 are schematic sectional elevation view of conventional stripe type semiconductor lasers.

A most typical example of conventional fundamental transverse mode operation has a buried stripe layers structure as shown in FIG. 1. Making of the conventional laser of FIG. 1 is as follows:

Firstly, the following layers are subsequently formed by epitaxial growth method
on a substrate 1 of $n^+$-GaAs:
   a first clad layer 2 of n-Ga$_{1-x}$Al$_x$As,
   an active layer 3 of n-GaAs,
   a second clad layer 4 of p-Ga$_{1-x}$Al$_x$As and
   an electrode contacting layer 5 of $p^+$-GaAs.

Secondly, an SiO$_2$ film (not shown) is formed on all the face of the electrode contacting layer 5, then the SiO$_2$ film is etched by known photo-etching method retaining a stripe shape part, and then by utilizing the stripe shape SiO$_2$ film as an etching mask, the above-mentioned epitaxial growth layers 2 to 5 are mesa-etched to form stripe shaped part.

Thirdly, into the mesa-etched spaces on both sides of the stripe shaped part are formed filled-in layers 6,6 having a high specific resistance and wider energy gap than those of layers 2 to 5 of the stripe shape part.

Then on the electrode contacting layer 5 and the filled-in layers 6,6 is formed an ohmic electrode 7, and another ohmic electrode 7 is formed on the bottom face of the substrate 1.

The abovementioned conventional laser of FIG. 1 has the following shortcomings.

A first shortcoming is that there is a possibility of contamination and/or oxidation of side faces of the stripe part during the while between the step of mesa-etching to form the stripe part and the subsequent step of forming filled-in layers 6,6. Especially, since the side faces of the active layer 3 serves as side faces of a cavity of laser, such contamination and/or oxidation of the side faces of the stripe part is likely to form dark spots of the laser and causes a deterioration of the laser.

Second shortcoming is that, since the SiO$_2$ film is retained on the stripe part during a high temperature processing step for the forming of the filled-in layers 6, a difference of thermal coefficient between the SiO$_2$ film and the $p^+$-GaAs layer 5 produces a stress of the active layer 3, thereby forming a cause of deterioration.

Third shortcoming is that such an impurity as Fe or Cr contained in the filled-in layers 6,6 for giving the layer a deep energy level is likely to diffuse into the side faces of the active layer 3, thereby deteriorating the characteristics.

Fourth shortcoming is poor heat radiation due to filling of high resistivity layer 6,6 which has poor heat conductivity.

Figure 2:
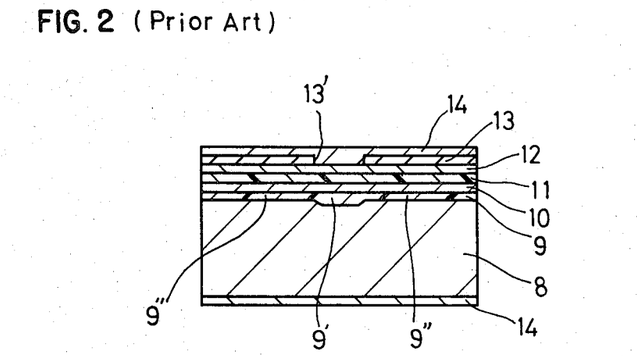

Recently, some improvements are proposed in order to eliminate the abovementioned shortcomings of the conventional semiconductor laser of buried-in stripe shape active region. One example of such improved structure is shown in FIG. 2. The conventional device of FIG. 2 is made as follows:

Firstly, the following layers are sequentially formed by epitaxial growth method
on a substrate 8 of $n^+$-GaAs:
   a specially shaped first clad layer 9 of n-Ga$_{1-x}$Al$_x$As,
   an active layer 10 of n-GaAs,
   a second clad layer 11 of p-Ga$_{1-x}$Al$_x$As, and
   an electrode contacting layer 12 of $p^+$-GaAs.

The shape of the first clad layer 9 is, as shown in FIG. 2, has a stripe shaped thicker part 9' at the central part and a thinner part 9", 9" on both sides of the thicker part 9'.

Secondly, an SiO$_2$ film 13 is formed on all the face of the electrode contacting layer 12, and then the SiO$_2$ film 13 is etched by known photo-etching method to form a stripe shape opening 13' over the position on the stripe shape thicker part 9', thereby exposing a stripe shape part of the surface of the electrode contacting layer 12.

Thirdly, an ohmic electrode 14 is formed on the face of the SiO$_2$ film 13 and on the exposed surface of the electrode contacting layer 12.

The conventional laser of FIG. 2 can operate a fundamental mode lasing in the part of the active layer 10 which is on the thicker part 9', since lights leaking from the side parts of the active layer 10 passes through the thinner parts 9", 9" and are absorbed in the substrate 8.

However, the abovementioned conventional laser of FIG. 2 has the shortcoming that the active region is flat, and hence, the light lased at the central part of the active layer 10 is likely to diverge in the horizontal direction of FIG. 2. Therefore, the lasing mode is distorted widthwise. Furthermore, the device of FIG. 2 has a poor heat radiation since in almost area the SiO$_2$ film 13 is inserted between the electrode contacting layer 12 and the ohmic electrode 14.

Figure 3:
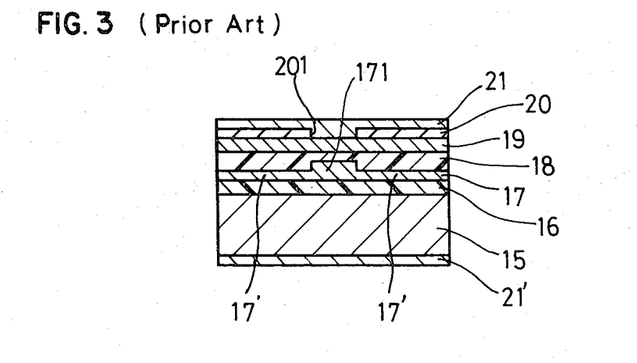

Another prior art of FIG. 3 has been known. The device of FIG. 3 has a rib shape active layer 17 having a stripe pattern thicker part 171 at the central part and thinner parts 17',17' on both sides thereof. The conventional semiconductor laser with rib shape active layer 17 is made as follows:

Firstly, the following layers are subsequently formed by epitaxial growth method
on a substrate 15 of $n^+$-GaAs:
   a first clad layer 16 of N-Ga$_{1-x}$Al$_x$As, and
   an active layer 17 of non-doped GaAs.

Secondly, the thinner parts 17',17' are formed by slightly etching the active layer 17 by utilizing a stripe shape mask of known material, thereby forming the rib shape active layer 17.

Thirdly, again by the epitaxial growth method, the following layers are subsequently formed on the rib shape active layer 17:
   a second clad layer 18 of p-Ga$_{1-x}$Al$_x$As and
   an electrode contacting layer 19 of $p^+$-GaAs.

Fourthly, an SiO$_2$ film 20 is formed on all the face of the electrode contacting layer 19, and then, the SiO$_2$ film 20 is etched by known photo-etching method to form a stripe shape opening 201 over the position on the stripe shape thicker part 171, thereby exposing a stripe shape part of the surface of the electrode contacting layer 19.

Fifthly, an ohmic electrode 21 is formed on the face of the SiO$_2$ film 10 and on the exposed surface of the electrode contacting layer 19.

The conventional laser of FIG. 3 has the advantage that by means of partly thickened active layer 17, the thicker part 171 and the thinner parts 17',17' has different values of effective refractive index. Therefore, the lased light can be effectively confined in the thicker part 171, and therefore, a stable transverse mode lasing is possible.

However, the conventional laser of FIG. 3 has the shortcomings that, since the etching of the active layer 17 is made to form the thinner parts 17',17', two sequences of epitaxial growths and delicate controlling of the etching are necessary, and further that there is a considerable possibility of introducing a number of non radiative center to the interface between the surface of the active layer 17 and the second clad layer 18 during exposing and etching of the active layer 17.

SUMMARY OF THE INVENTION

The present invention purports to provide improved semiconductor laser construction capable of stable fundamental transverse mode lasing and method of making the same.

BRIEF DESCRIPTION OF THE DRAWINGS

FIG. 6(a), FIG. 6(b), FIG. 6(c), FIG. 6(d), and FIG. 6(e) are schematic sectional elevation views of various steps of making of a third example of semiconductor laser in accordance with the present invention.

DETAILED DESCRIPTION OF PREFERRED EXAMPLES

The semiconductor laser of the present invention comprises an active layer epitaxially formed on a semiconductor substrate and at least a current limiting layer which defines a current injection region of a stripe shape, and the laser is characterized in that the active layer has two bending parts between which a stripe shape active region is defined facing said current injection region. The feature of the present invention is that the abovementioned bending parts are formed by utilizing a semiconductor substrate having a terrace section.

EXAMPLE 1

Figure 4A:
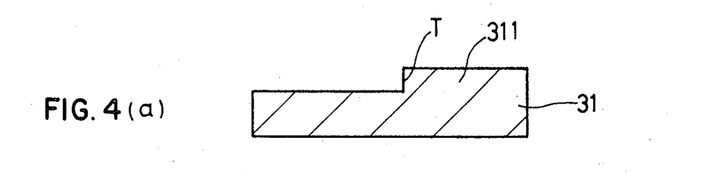
FIG. 4(a), FIG. 4(b), FIG. 4(c) and FIG. 4(d) are schematic sectional elevation views of various steps of making of a first example of semiconductor laser in accordance with the present invention.

Example 1 shown in FIG. 4 is elucidated hereafter:

Firstly, a terrace 311 is formed on a principal face of a substrate 31 of n-type conductivity by, for example, etching a half part of the principal face to form a step T, as shown in FIG. 4(a).

Figure 4B:
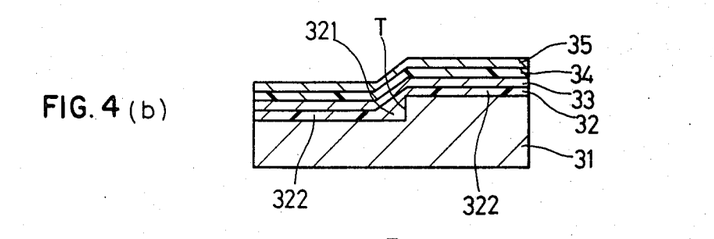

Secondly, as shown in FIG. 4(b), the following layers are formed in sequence by epitaxial growing:
on the substrate 31 of n+-type conductivity:
  a thin first clad layer 32 of n-type conductivity,
  an active layer 33 of non-doping,
  a second clad layer 34 of p-type conductivity, and
  an electrode contacting layer 35 of p+-type conductivity.

In the abovementioned sequential epitaxial growths, a thick part 321 is formed at the foot of the step T in the first clad layer 32.

Figure 4C:
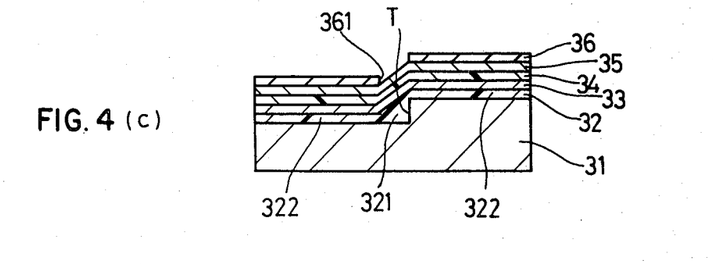

Thirdly, an insulating film 36 as current limiting layer is formed on all the face of the electrode contacting layer 35, and then, the insulating film 36 is etched so as to expose a stripe shape part of the surface of the electrode contacting layer 35, by known photo-etching method, thus forming a stripe shape current injecting opening 361 over the thick part 321, as shown in FIG. 4(c). The width of the stripe current injecting opening 361 is preferably under 10 μm in order to desirably limit the dispersion of the current.

Figure 4D:
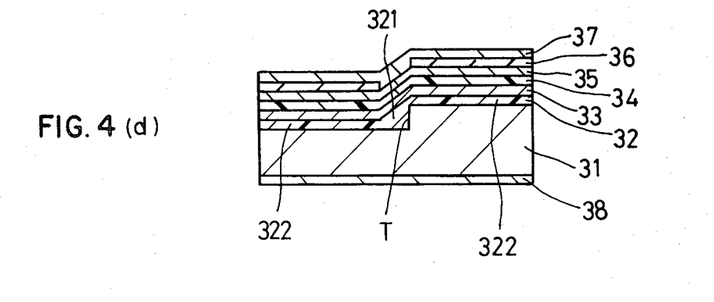

Fourthly, after diffusion an impurity, such as zinc, for ohmic contact onto the exposed surface of the electrode contacting layer 35 through the opening 361, an ohmic contact electrode 37 is formed on the exposed surface of the electrode contacting layer 35 as well as on the surface of the insulating film 36. And, another ohmic contact electrode 38 is formed on the bottom face of the n+-type substrate 31, as shown in FIG. 4(d).

For the semiconductor substances of the abovementioned example, for example, the followings can be used:

(1) Ga$_{1-y}$Al$_y$As for the active layer and Ga$_{1-x}$Al$_x$As for the clad layers ($0 \leq y < x < 1$).
(2) InGaAsP for the active layer and InP for the clade layers.
(3) GaInAs for the active layer and GaInP for the clad layers.
(4) GaAlAsSb for the active layer and GaAlAs for the clad layers.

The device made by the abovementioned method has a structural feature that the first clad layer 32 has a thicker part 321 at the foot of the terrace and thinner parts 322,322 in other part than the thicker part 321. Therefore, through the thinner parts 322,322 the substrate 31 absorbs lights of the off-center parts of the active layer 33. Furthermore, the first clad layer 32 forms a bent face consisting of an upper horizontal part, a lower horizontal part and a narrow stripe shaped oblique part inbetween. Accordingly, the thin active layer 33 formed on the bent face of the first clad layer 32 has a similar bent configuration, and hence two bent parts on both sides of its stripe shape oblique part. Such bent parts on both parts of the oblique part of the active layer 33 serves to confine light in the oblique part, thereby producing a stable fundamental mode lasing.

The laser of the example of FIG. 4(d) does not have the abovementioned shortcomings of the conventional lasers of FIG. 1 to FIG. 3. And furthermore, the laser of the example of FIG. 4(d) has a high stability of lasing mode, and also has simpler manufacturing process than the conventional laser, since the epitaxial growth process can be made in one sequence.

An example of making laser of FIG. 4(d) where the active layer is of GaAs and the clad layers are of $Ga_{1-x}Al_xAs$ is as follows:

Firstly, on a principal face of a (100) plane of an $n^+$-GaAs substrate 31, a terrace is formed by selective chemical etching in a manner that the vertical plane of the step T of about 1 μm of the terrace is vertical to a (110) plane, i.e., a cleavage plane, thereby forming the substrate of FIG. 4(a).

Secondly, on the substrate 31, the following layers are formed as shown in FIG. 4(b), by a sequential liquid phase epitaxial growth of starting temperature of 850° C. and cooling rate of 0.5° C./minute, a first clad layer 32 of 0.2 μm thick n-$Ga_{1-x}Al_xAs$ by a growth period of 20 seconds, a non doped active layer 33 of 0.1 μm thick GaAs by a growth period of 1 second, a second clad layer 34 of 1.5 μm thick p-$Ga_{1-x}Al_xAs$ by a growth period of 1.5 minutes, and an electrode contacting layer 35 of 1 μm thick p-GaAs by a growth period of 1.5 minutes.

Thirdly, a 3000Å thick $Si_3N_4$ film 36 is formed on the electrode contacting layer 35 by a known method, and stripe shaped opening 361 of 5 μm width is formed over an oblique part of the active layer 33 formed over the foot part of the step T, as shown in FIG. 4(c).

Fourthly, after diffusing zinc onto the exposed surface of the electrode contacting layer 35 through the opening 361, an ohmic contact electrode 37 is formed by sequential sputtering of Ti and Pt followed by vacuum deposition of Au. Also, after lapping and subsequent chemical etching of the bottom face of the substrate 31 to control thickness of the substrate, another ohmic contact electrode 38 is formed on the bottom face of the substrate 31 by vacuum deposition of a known alloy of Au-Ge-Ni, thus making the device shown in FIG. 4(d).

A number of lasers made continuously in lines and rows in a wafer are then divided into individual pieces, and the electrode 37 is heat-bonded to a heat sink and gold wire is bonded to the electrode 38.

The GaAs-$Ga_{1-x}Al_xAs$ semiconductor laser manufactured by the abovementioned process performs a satisfactory operation of stable continuous lasing of fundamental mode at room temperature.

EXAMPLE 2

Figure 5A:
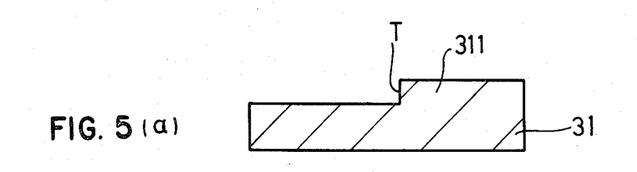
FIG. 5(a), FIG. 5(b), FIG. 5(c) and FIG. 5(d) are schematic sectional elevation views of various steps of making of a second example semiconductor laser in accordance with the present invention.

Example 2 shown in FIG. 5 is elucidated hereafter:

Firstly, a terrace 311 is formed on a principal face of a substrate 31 of n-type conductivity by, for example, etching a half part of the principal face to form a step T, as shown in FIG. 5(a).

Figure 5B:
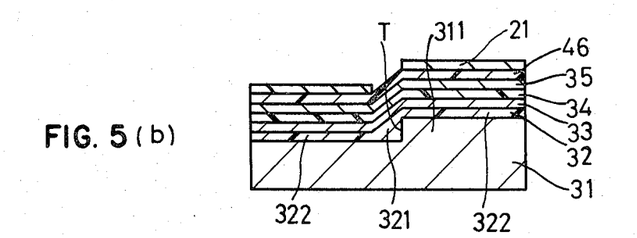

Secondly, as shown in FIG. 5(b), the following layers are formed in sequence by liquid phase epitaxial growing:

on the substrate 31 of $n^+$-type conductivity:
a thin first clad layer 32 of n-type conductivity,
an active layer 33 of non-doping,
a second clad layer 34 of p-type conductivity,
an electrode contacting layer 35 of $p^+$-type conductivity, and
a current limiting layer 46 of n-type conductivity and capable of selective etching.

In the abovementioned sequential epitaxial growths, a thick part 321 is formed at the foot of the step T in the first clad layer 32. Also, though not shown in the drawing, the active layer 33 becomes thicker on the thick part 321 than on other parts of the first clad layer 32.

Figure 5C:
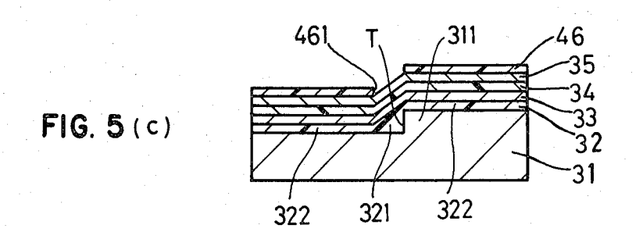

Thirdly, an etching mask (not shown) is formed on the face of the current limiting layer 46, and then, a stripe shape opening 461 is formed in the etching mask so as to expose a stripe shape part of the surface of the current limiting layer 46 by known photo-etching method. Then by etching the exposed stripe shaped surface of the current limiting layer 46 by utilizing the etching mask, the opening 461 is formed over the thick part 321, as shown in FIG. 5(c). The width of the stripe shape current injection opening 461 is preferably under 10μm in order to desirably limit the dispersion of the current.

Figure 5D:
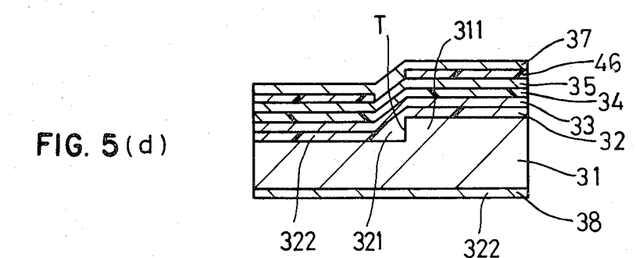

Fourthly, after diffusing an impurity, such as zinc, for ohmic contact onto the exposed surface of the electrode contacting layer 35 through the openings of the etching mask and of the current limiting layer 461, an ohmic contact electrode 37 is formed on the exposed surface of the electrode contacting layer 35, as well as on the surface of the current limiting layer 46, And, another ohmic contact electrode 38 is formed on the bottom face of the $n^+$-type substrate, as shown in FIG. 5(d).

For the semiconductor substances of the above-mentioned example, for example, the followings can be used:

(1) $Ga_{1-y}Al_yAs$ for the active layer and $Ga_{1-x}Al_xAs$ for the clad layers ($0 \leq y < x < 1$).
(2) InGaAsP for the active layer and InP for the clad layers.
(3) GaInAs for the active layer and GaInP for the clad layers.
(4) GaAlAsSb for the active layer and GaAlAs for the clad layers.

The device made by the abovementioned method has a structural feature that the first clad layer 32 has a thicker part 321 at the foot of the terrace and thinner parts 322,322 in other part than the thicker part 321. Therefore, through the thinner parts 322,322 the substrate 31 absorbs lights of the off-center parts of the active layer 33. Furthermore, the first clad layer 32 forms a bent face consisting of an upper horizontal part, a lower horizontal part and a narrow stripe shaped oblique part inbetween. Accordingly, the thin active layer 33 formed on the bent face of the first clad layer 32 has a similar bent configuration, and hence two bent parts on both sides of its stripe shape oblique part. Such bent parts on both parts of the oblique part of the active layer 33 serves to confine light in the oblique part, thereby producing a stable fundamental mode lasing.

The laser of the example of FIG. 5(d) does not have the abovementioned shortcomings of the conventional lasers of FIG. 1 to FIG. 3. The laser of the example of FIG. 5(d) has a higher stability of lasing mode, and also has simpler manufacturing process than the conventional laser, since the epitaxial growth process can be made in one sequence. Furthermore, the laser of this example has a current limiting layer 46 made by the epitaxial growth instead of $SiO_2$ film. Therefore, heat radiation of the device is satisfactory and there is no problem of deterioration by stress caused by difference of thermal expansion coefficients in the device.

An example of making a laser of FIG. 5(d) where the active layer is of GaAs and the clad layers are of $Ga_{1-x}Al_xAs$ is as follows:

Firstly, on a principal face of a (100) plane of an n+-GaAs substrate 31, a terrace is formed by selective chemical etching in a manner that the vertical plane of the step T of about 1μm of the terrace is vertical to a (110) plane, i.e., a cleavage plane, thereby forming the substrate of FIG. 5(a).

Secondly, on the substrate 31, the following layers are formed as shown in FIG. 5(b), by a sequential liquid phase epitaxial growth of starting temperature of 850° C. and cooling rate of 0.5° C./minute, a first clad layer 32 of 0.2μm thick n-$Ga_{1-x}Al_xAs$ by a growth period of 20 seconds, a non doped active layer 33 of 0.1μm thick GaAs by a growth period of 1 second, a second clad layer 34 of 1.5μm thick p-$Ga_{1-x}Al_xAs$ by a growth period of 1.5 minutes, an electrode contacting layer 35 of 1μm thick p-GaAs by a growth period of 1.5 minutes, and a current limiting layer 46 of 1μm thick n-$Ga_{1-y}Al_yAs$ by a growth period of 1.5 minutes.

Thirdly, an about 3000Å thick $Si_3N_4$ film (not shown) is formed on the current limiting layer 46 by a known method, and stripe shaped opening of 5μm width is formed over an oblique part of the active layer 33 formed over the foot part of the step T, as shown in FIG. 5(c). Then the exposed stripe shaped part of the underlying current limiting layer 46 is selectively etched by known chemical etching method by utilizing the $Si_3N_4$ film with the stripe shaped opening as an etching mask, thereby forming an opening 461, through which the surface of the electrode contacting layer 35 is exposed. In the selective etching of the current limiting layer 46, in order not to etch the electrode contacting layer 35 a selective etchant such as 30% HCl of 60° C., 30% $H_3PO_4$ of 130° C. or their mixture of about 60° C. is used.

Fourthly, after diffusing zinc onto the exposed surface of the electrode contacting layer 35 through the opening 461, an ohmic contact electrode 37 is formed by sequential sputtering of Ti and Pt followed by vacuum deposition of Au. Also, after lapping and subsequent chemical etching of the bottom face of the substance 31 to control thickness of the substrate, another ohmic contact electrode 38 is formed on the bottom face of the substrate 31 by vacuum deposition of a known alloy of Au-Ge-Ni, thus making the device shown in FIG. 5(d).

A number of lasers made continuously in lines and rows in a wafer are then divided into individual pieces, and the electrode 37 is heat-bonded to a heat sink and gold wire is bonded to the electrode 38.

The GaAs-$Ga_{1-x}Al_xAs$ semiconductor laser manufactured by the abovementioned process performs a satisfactory operation of stable continuous lasing of fundamental mode at room temperature and has a satisfactory heat radiation characteristic.

EXAMPLE 3

Figure 6A:
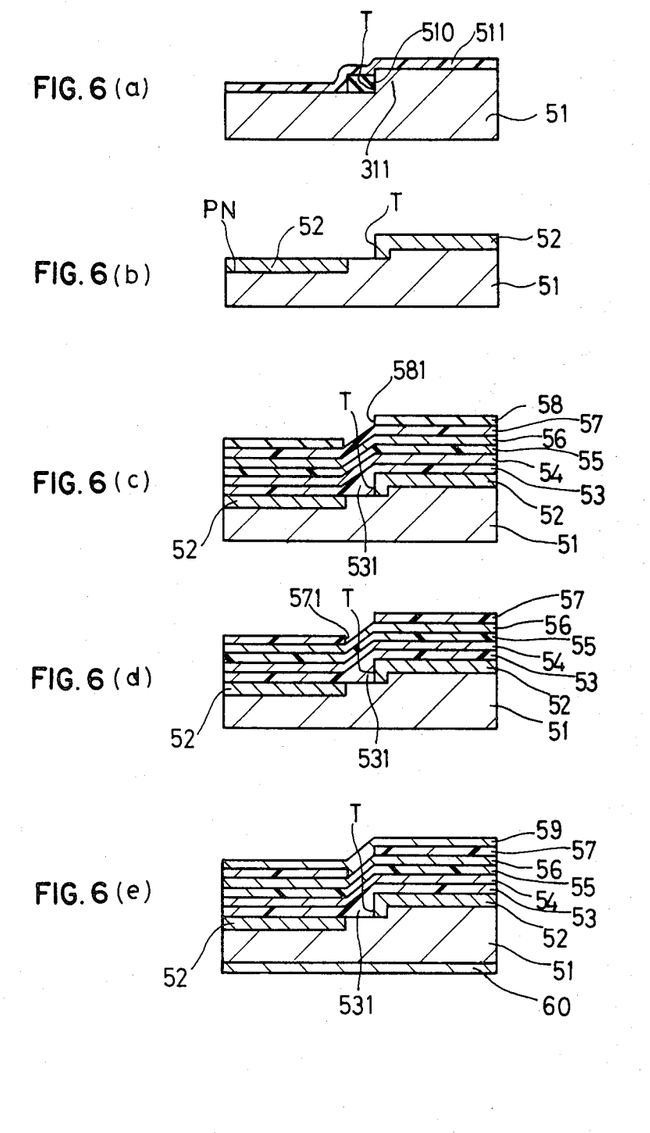

Example 3 shown in FIG. 6 is elucidated hereafter:

Firstly, a terrace is formed on a principal face of a substrate 51 of n+-type conductivity by, for example, etching a half part of the principal face to form a step T. Then, a stripe shaped diffusion prevention mask 510 is formed at the foot of the step and a diffusion control mask 511 (e.g. an $SiO_2$ mask) is formed on all the face of the substrate as shown in FIG. 6(a). And a p-type impurity is selectively diffused into the substrate 51 and thereafter the masks 511 and 510 are removed, thereby forming diffused layers 52, 52 on the face of the substrate as shown FIG. 6(b).

Secondly, as shown in FIG. 6(c), the following layers are formed in sequence by liquid phase epitaxial growing:

on the substrate 51 of n+-type conductivity with selectively diffused regions 52 of p-type conductivity:
a thin first clad layer 53 of n-type conductivity,
an active layer 54 of non doping,
a second clad layer 55 of p-type conductivity,
an electrode contacting layer 56 of p+-type conductivity, and
a current limiting layer 57 of n-type conductivity and capable of selective etching.

In the abovementioned sequential epitaxial growths, a thick part 531 is formed at the foot of the step T in the first clad layer 53. Also, though not shown in the drawing, the active layer 54 becomes thicker on the thick part 531 than on other parts of the clad layer 53.

Thirdly, an etching mask 58 is formed on all the face of the current limiting layer 57 and then, a stripe shape opening 581 is formed in the etching mask 58 so as to expose a stripe shape part of the surface of the current limiting layer 57 by known photo-etching method as shown in FIG. 6(c). Then by etching the exposed stripe shaped surface of the current limiting layer 57 by utilizing the etching mask 58 the opening 571 is formed over the thick part 531. The width of the stripe shape current injection opening 571 is preferably under 10 μm in order to desirably limit the dispersion of the current.

Fourthly, after diffusing an impurity, such as zinc, for ohmic contact onto the exposed surface of the electrode contacting layer 56 through the openings of the etching mask and of the current limiting layer the etching mask 58 is removed as shown in FIG. 6(d).

Fifthly, an ohmic contact electrode 59 is formed on the exposed surface of the electrode contacting layer 56, as well as the surface of the current limiting layer 57. And, another ohmic contact electrode 60 is formed on the bottom face of the n+-type substrate, as shown in FIG. 6(e).

For the semiconductor substances of the abovementioned example, for example, the following can be used:
(1) $Ga_{1-y}Al_yAs$ for the active layer and $Ga_{1-x}Al_xAs$ for the clad layers ($0 \leq y < x < 1$).
(2) InGaAsP for the active layer and InP for the clad layers.
(3) GaInAs for the active layer and GaInP for the clad layers.
(4) GaAlAsSb for the active layer and GaAlAs for the clad layers.

The device made by the abovementioned method has a structural feature that the first clad layer 53 has a thicker part 531 at the foot of the terrace and thinner parts in other part than the thicker part 531. Therefore, through the thinner parts the substrate 51 absorbs lights of the off-center parts of the active layer 54. Furthermore, the first clad layer 53 forms a bent face consisting of an upper horizontal part, a lower horizontal part and a narrow stripe shaped oblique part inbetween. Accordingly, the active layer 54 formed on the bent face of the first clad layer 53 has a similar bent configuration, and hence two bent parts on both sides of its stripe shape oblique part. Such bent parts on both parts of the oblique part of the active layer 54 serves to confine light in the oblique part, thereby producing a stable fundamental mode. Also, by means of cooperation of current path narrowings by the current limiting layer 57 and the p-n junction formed under the diffused layers 52, 52, the current injected to the active layer 54 is concentrated to a narrow part. Therefore, the mode of lasing is stable.

Furthermore, though not shown in the drawing, the active layer 54 is thick at the oblique part between two bent parts, and therefore, the fundamental mode is easily confined in the thick part of the active layer 54.

The laser of the example of FIG. 6(e) does not have the abovementioned shortcomings of the conventional lasers of FIG. 1 to FIG. 3. And furthermore, the laser of the example of FIG. 6(e) has a higher stability of lasing mode and satisfactory heat radiation characteristic, and also has simpler manufacturing process than the conventional laser, since the epitaxial growth process can be made in one sequence. Furthermore, the laser of this example has a current limiting layer 57 made by the epitaxial growth instead of $SiO_2$ film. Therefore, heat radiation of the device is satisfactory and there is no problem of deterioration by stress caused by difference of thermal expansion coefficients in the device.

An example of making a laser of FIG. 6(e) where the active layer 54 is of GaAs and the clad layers 53 and 55 are of $Ga_{1-y}Al_yAs$ is as follows:

Firstly, on a principal face of a (100) plane of an n+-GaAs substrate 51, a terrace is formed by selective chemical etching in a manner that the vertical plane of the step T of about 1 μm of the terrace is vertical to a (110) plane, i.e., a cleavage plane. Then, a 5 μm width stripe shaped diffusion prevention mask 510 of 3000 Å thick $Si_3N_4$ is formed at the foot of the step and a diffusion control mask 511 of 1500 Å thick $SiO_2$ is formed on all faces of the substrate as shown in FIG. 6(a). And a p-type impurity of zinc is selectively diffused through the $SiO_2$ film 511 at 800° C. into the substrate 51 and thereafter the masks 510 and 511 are removed, thereby formning diffused layers 52, 52 on the face of the substrate as shown in FIG. 6(b). In the diffusion, there is no problem that the zinc diffuses underneath the diffusion prevention mask 511. The surface concentration of the diffused impurity was $10^{18}$ atoms/$cm^3$.

Secondly, on the substrate 51 of the n+-GaAs the following layers are formed as shown in FIG. 6(b), by a sequential liquid phase epitaxial growth of starting temperature of 850° C. and cooling rate of 0.5° C./minute,
- a first clad layer 53 of 0.2 μm thick n-$Ga_{1-x}Al_xAs$ by a growth period of 20 seconds,
- a non doped active layer 54 of 0.1 μm thick n-GaAs by a growth period of 1 second,
- a second clad layer 55 of 1.5 μm thick p-$Ga_{1-x}Al_xAs$ by a growth period of 1.5 minutes,
- an electrode contacting layer 56 of 1 μm thick p-GaAs by a growth period of 1.5 minutes, and
- a current limiting layer 57 of 1 μm thick n-$Ga_{1-y}Al_yAs$ by a growth period of 1.5 minutes.

Thirdly, an about 3000 Å thick $Si_3N_4$ film 58 is formed as an etching mask on the current limiting layer 57 by a known method, and stripe shaped opening of 5 μm width is formed over an oblique part of the active layer 54 formed over the foot part of the step T, as shown in FIG. 6(c). Then the exposed stripe shaped part of the underlying current limiting layer 57 is selectively etched by known chemical etching method by utilizing the $Si_3N_4$ mask 58 with the stripe shaped opening as the etching mask, thereby forming an opening 571, through which the surface of the electrode contacting layer 56 is exposed. In the selective etching of the current limiting layer 57, in order not to etch the electrode contacting layer 56, a selective etchant such as 30% HCl of 60° C., 30% $H_3PO_4$ of 130° C. or their mixture of about 60° C. is used.

Fourthly, after diffusion zinc onto the exposed surface of the electrode contacting layer 56 through the opening 571 and removing the mask film 58, an ohmic contact electrode 59 is formed by sequential sputtering of Ti and Pt followed by vacuum deposition of Au. Also, after lapping and subsequent chemical etching of the bottom face of the substrate 51 to control thickness of the substrate, another ohmic contact electrode 60 is formed on the bottom face of the substrate 51 by vacuum deposition of a known alloy of Au-Ge-Ni, thus making the device shown in FIG. 6(e).

A number of lasers made continuously in lines and rows in a wafer are then divided into individual pieces, and the electrode 59 is heat-bonded to a heat sink and a gold wire is bonded to the electrode 60.

The GaAs-$Ga_{1-x}Al_xAs$ semiconductor laser manufactured by the abovementioned process performs a satisfactory operation of stable continuous lasing of fundamental mode at room temperature and has a satisfactory heat radiation characteristic.

By the use of diffusing control mask 511 of $SiO_2$, deterioration of the substrate surface, which adversely affect the characteristic of the epitaxial growth layers, can be satisfactorily eliminated.

EXAMPLE 4

Figure 7A:
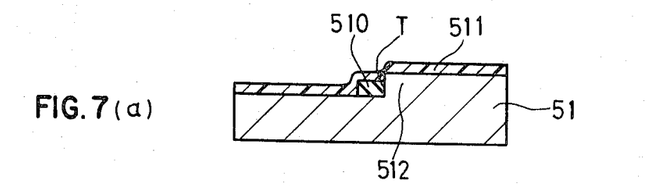
FIG. 7(a), FIG. 7(b), FIG. 7(c), FIG. 7(d), and FIG. 7(e) are schematic sectional elevation views of various steps of making of a fourth example of semiconductor laser in accordance with the present invention.

Example 4 shown in FIG. 7 is elucidated hereafter:

Firstly, a terrace 512 is formed on a principal face of a substrate 51 of n+-type conductivity by, for example, etching a half part of the principal face to form a step T.

Figure 7B:
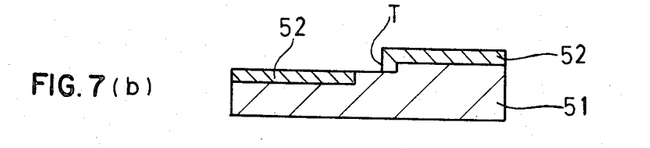

Then, a stripe shaped diffusion prevention mask 510 is formed at the foot of the step and a diffusion control mask 511 is formed on all the face of the substrate as shown in FIG. 7(a). And a p-type impurity is selectively diffused into the substrate 51 and thereafter the masks 511 and 510 are removed in sequence, thereby forming diffused layers 52, 52 on the face of the substrate as shown in FIG. 7(b).

Figure 7C:
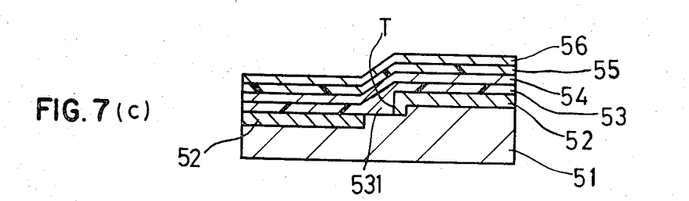

Secondly, as shown in FIG. 7(c), the following layers are formed in sequence by liquid phase epitaxial growing:
on the substrate 51 of n+-type conductivity with selectively diffused regions 52 of p-type conductivity:
- a thin first clad layer 53 of n-type conductivity,
- an active layer 54 of non doping,
- a second clad layer 55 of p-type conductivity, and
- an electrode contacting layer 56 of p-type conductivity.

In the abovementioned sequential epitaxial growths, a thick part 531 is formed at the foot of the step T in the first clad layer 53. Also, though not shown in the drawing, the active layer 54 becomes thicker on the thick part 531 than on other parts of the first clad layer 53.

Figure 7D:
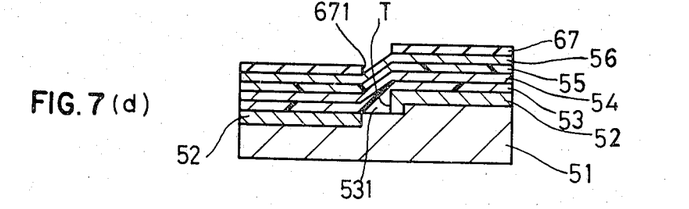

Thirdly, an insulating film 67 as current limiting layer is formed on all the face of the electrode contacting layer 56, and then, the insulating film 67 is etched so as to expose a stripe shape part of the surface of the electrode contacting layer 56, by known photo-etching method, thus forming a stripe shape current injecting opening 671 over the thick part 531, as shown in FIG. 7(d). The width of the stripe shape current injecting opening 671 is preferably under 10 μm in order to desirably limit the dispersion of the current.

Figure 7E:
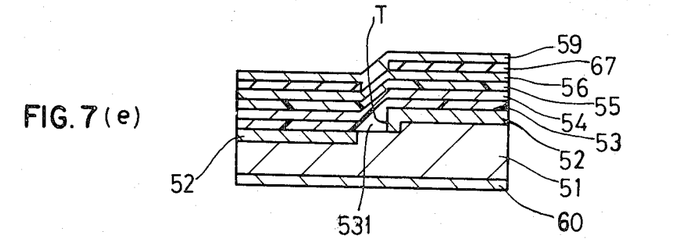

Fourthly, after diffusing an impurity, such as zinc, for ohmic contact onto the exposed surface of the electrode contacting layer 56 through the opening 671, an ohmic contact electrode 59 is formed on the exposed surface of the electrode contacting layer 56 as well as on the surface of the insulating film 67. And, another ohmic contact electrode 60 is formed on the bottom face of the n+-type substrate 51, as shown in FIG. 7(e).

For the semiconductor substances of the abovementioned example, for example, the followings can be used:

(1) $Ga_{1-y}Al_yAs$ for the active layer and $Ga_{1-x}Al_xAs$ for the clad layers ($0 \leq y < x < 1$).
(2) InGaAsP for the active layer and InP for the clad layers.
(3) GaInAs for the active layer and GaInP for the clad layers.
(4) GaAlAsSb for the active layer and GaAlAs for the clad layers.

The device made by the abovementioned method has a structural feature that the first clad layer 53 has a thicker part 531 at the foot of the terrace and thinner parts in other part than the thicker part. Therefore, through the thinner parts the substrate 51 absorbs lights of the off-center parts of the active layer 54. Furthermore, the first clad layer 53 forms a bent face consisting of an upper horizontal part, a lower horizontal part and a narrow stripe shaped oblique part inbetween. Accordingly, the thin active layer 54 formed on the bent face of the first clad layer 53 has a similar bent configuration, and hence two bent parts on both sides of its stripe shape oblique part. Such bent parts on both parts of the oblique part of the active layer 54 serves to confine light in the oblique part, thereby producing a stable fundamental mode lasing. Also, by means of cooperation of current path narrowings by the current limiting layer 57 and the p-n junction formed under the diffused layers 52, 52, the current injected to the active layer 54 is concentrated to a narrow part. Therefore, the mode of lasing is stable.

The laser of the example of FIG. 7(e) does not have the abovementioned shortcomings of the conventional lasers of FIG. 1 to FIG. 3. And furthermore, the laser of the example of FIG. 7(e) has a higher stability of lasing mode, and also has simpler manufacturing process than the conventional laser, since the epitaxial growth process can be made in one sequence.

An example of making a laser of FIG. 7(e) where the active layer is of GaAs and the clad layers are of $Ga_{1-x}Al_xAs$ is as follows:

Firstly, on a principal face of a (100) plane of an n+-GaAs substrate 51, a terrace is formed by selective chemical etching in a manner that the vertical plane of the step T of about 1 μm of the terrace is vertical to a (110) plane, i.e., a cleavage plane. Then, a 5 μm width stripe shaped diffusion prevention mask 510 of 3000Å thick $Si_3N_4$ is formed at the foot of the step and a diffusion control mask 511 of 1500Å thick $SiO_2$ is formed on all the face of the substrate as shown in FIG. 7(a). And a p-type impurity of zinc is selectively diffused through the $SiO_2$ film 511 at 800° C. into the substrate 51, and thereafter the masks 511 and 510 are removed, thereby forming diffused layers 52, 52 on the face of the substrate as shown in FIG. 7(b). In the diffusion, there is no problem that the zinc diffuses underneath the diffusion prevention mask 511. The surface concentration of the diffused impurity was $10^{18}$ atoms/cm³.

Secondly, on the substrate 51, the following layers are formed as shown in FIG. 7(c), by a sequential liquid phase epitaxial growth of starting temperature of 850° C. and cooling rate of 0.5° C./minute, a first clad layer 53 of 0.2 μm thick n-$Ga_{1-x}Al_xAs$ by a growth period of 20 seconds,
a non doped active layer 54 of 0.1 μm thick GaAs by a growth period of 1 second,
a second clad layer 55 of 1.5 μm thick p-$Ga_{1-x}Al_xAs$ by a growth period of 1.5 minutes, and
an electrode contacting layer 56 of 1 μm thick p-GaAs by a growth period of 1.5 minutes.

Thirdly, a 3000Å thick $Si_3N_4$ film 67 is formed on the electrode contacting layer 56 by a known method, and a stripe shaped opening 671 of 5 μm width is formed over an oblique part of the active layer 54 formed over the foot part of the step T, as shown in FIG. 7(d).

Fourthly, after diffusing zinc onto the exposed surface of the electrode contacting layer 56 through the opening 671, an ohmic contact electrode 59 is formed by sequential sputtering of Ti and Pt followed by vacuum deposition of Au.

Also, after lapping and subsequent chemical etching of the bottom face of the substrate 51 to control thickness of the substrate, another ohmic contact electrode 60 is formed on the bottom face of the substrate 51 by vacuum deposition of a known alloy of Au-Ge-Ni, thus making the device shown in FIG. 7(e).

A number of lasers made continuously in lines and rows in a wafer are then divided into individual pieces, and the electrode 59 is heat-bonded to a heat sink and gold wire is bonded to the electrode 60.

The GaAs-$Ga_{1-x}Al_xAs$ semiconductor laser manufactured by the abovementioned process performs a satisfactory operation of stable continuous lasing of fundamental mode at room temperature.

A modification of the laser of this example is made by replacing the diffused layers 52, 52 by a high resistivity layer on the semiconductor substrate having a terrace section.

EXAMPLE 5

Figure 8A:
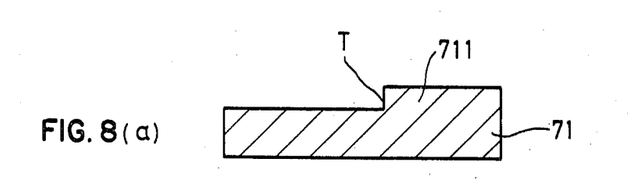
FIG. 8(a), FIG. 8(b) and FIG. 8(c) are schematic sectional elevation views of various steps of making of a fifth example of semiconductor laser in accordance with the present invention.
Figure 8B:
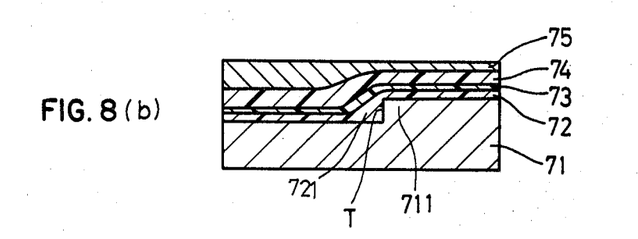
Figure 8C:
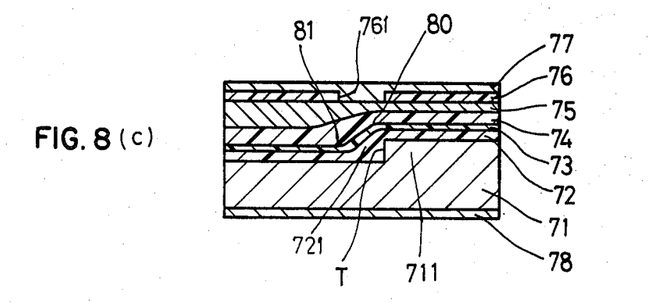

Example 5 shown in FIG. 8 is elucidated hereafter:

Firstly, a terrace 711 is formed on a principal face of a substrate 71 of n-type conductivity by, for example, etching a half part of the principal face to form a step T, as shown in FIG. 8(a).

Secondly, as shown in FIG. 8(b), the following layers are formed in sequence by liquid phase epitaxial growing:
on the substrate 71 of n⁻-type conductivity:
a thin first clad layer 72 of n-type conductivity,
an active layer 73 of non doping,
a second clad layer 74 of p-type conductivity, and
an electrode contacting layer 75 of p+-type conductivity, In the abovementioned sequential epitaxial growths, a thick part 721 is formed at the foot of the step T in the first clad layer 72.

Thirdly, an insulating film 76 as current limiting layer is formed on all the face of the electrode contacting layer 75, and then, the insulating film 76 is etched so as to expose a stripe shape part of the surface of the electrode contacting layer 75, by known photo-etching method, thus forming a stripe shape current injecting opening 761 over the thick part 721 as shown in FIG.

8(c). The width of the stripe shape current injecting opening 761 is preferably under 10 μm in order to desirably limit the dispersion of the current.

Fourthly, after diffusing an impurity, such as zinc, for ohmic contact onto the exposed surface of the electrode contacting layer 75 through the opening 761, an ohmic contact electrode 77 is formed on the exposed surface of the electrode contacting layer 75 as well as on the surface of the insulating film 76. And, another ohmic contact electrode 78 is formed on the bottom face of the n+-type substrate 71, as shown in FIG. 7(c). Instead of the abovementioned insulating layer 76, a current limiting layer of the conductivity type of the substrate 71 can be used.

For the semiconductor substances of the abovementioned example, for example, the followings can be used:
(1) $Ga_{1-y}Al_yAs$ for the active layer and $Ga_{1-x}Al_xAs$ for the clad layers ($0 \leq y < x < 1$).
(2) InGaAsp for the active layer and InP for the clad layers.
(3) GaInAs for the active layer and GaInP for the clad layers.
(4) GaAlAsSb for the active layer and GaAlAs for the clad layers.

In general, when an epitaxial growth layer is formed on a substrate having a terrace part, at an initial stage of the epitaxial growth the growth speed of the concave corner part, i.e., of the part at the foot of the step of the terrace, is greater than that of other parts, and this phenomena is dominant especially in the first grown layer, i.e., first clad layer 72. Accordingly, by selecting the growth condition it is possible that the first clad layer 72 has a thick part 721 which is around the step and sufficiently thick for preventing light absorption by the substrate 71 and a thinner parts which are far from the step part and sufficiently thin for allowing absorption of light into the substrate 71 therethrough.

When the laser of this example is a GaAs-GaAlAs laser and the first clad layer 72 is an n-type $Ga_{0.7}Al_{0.3}As$, the light absorption coefficients for several thicknesses of the first clad layer is as follows:

1 μm thick: 10 cm$^{-1}$
0.5 μm thick: 100 cm$^{-1}$
0.3 μm thick: 300 cm$^{-1}$
0.2 μm thick: 1000 cm$^{-1}$.

Therefore, by making the thickness of the thick part 721 to be over 1 μm, the absorption of light in the oblique part of the active layer 73 through the thick part 721 into the substrate 71 is substantially prevented. Also, by making the far away thin part to be under 0.5 μm, the light in the far away part (horizontal part of the active layer 73) is considerably absorbed through the thin part of the first clad layer 72 into the substrate.

Furthermore, the first clad layer 72 forms a bent face consisting of an upper horizontal part, a lower horizontal part and a narrow striped shaped oblique part inbetween as shown in FIG. 8(c). Accordingly, the thin active layer 73 formed on the bent face of the first clad layer 72 has a similar bent configuration, and hence two bent parts 80 and 81 on both sides of its stripe shape oblique part. Such bent parts on both parts of the oblique part of the active layer 73 serves to prevent light from leaking therethrough. Therefore, the oblique part between the pair of bent parts 80 and 81 is optically isolated from the horizontal parts, thereby having a different lasing mode from the latter. Accordingly, a fundamental mode lasing is produced in the oblique part of the active layer 73.

Furthermore, it is confirmed that the thickness of the active layer 73 becomes 10 to 20% thicker at the oblique part which is between the bent parts 80 and 81, in comparison with other parts (i.e., horizontal parts) of the active layer 73. Therefore, the active layer 73 forms a rib shape waveguide configuration and the lased light is confined in the oblique part between the two bent parts 80 and 81. The difference of effective refractive indexes of light of the thicker part and the thinner part of the active layer 73 is of the order of $10^{-3}$. In order to obtain a lasing in $TE_{00}$ mode for such value of the difference, it is required that the width of the lasing region is preferably under 3 μm. For the width of about 5 μm, there is a possibility of lasing in $TE_{01}$ mode. However, in the construction of FIG. 8(c), since the thickness of the active layer continuously decreases as a position departs from the center of the oblique part of the active region, the light absorption by the substrate becomes large as the position departs from the center. Accordingly, the mode of lasing becomes fundamental at or around the center. Therefore, the present laser can perform a stable fundamental mode of lasing.

The laser of the example of FIG. 8(c) does not have the abovementioned shortcomings of the conventional lasers of FIG. 1 to FIG. 3. And furthermore, the laser of the example of FIG. 8(c) has simpler manufacturing processes than the conventional laser, since the epitaxial growth process can be made in one sequence.

An example of making a laser of FIG. 8(c) where the active layer is of GaAs and the clad layers are of $Ga_{1-x}Al_xAs$ is as follows:

Firstly, on a principal face of a (100) plane of an n+-GaAs substrate 71, a terrace is formed by selective chemical etching in a manner that the vertical plane of the step T about 2 μm of the terrace is vertical to a (110) plane, i.e., a cleavage plane, thereby forming the substrate of FIG. 8(a).

Secondly, on the substrate 71, the following layers are formed as shown in FIG. 8(b), by a sequential liquid phase epitaxial growth of starting temperature of 845° C. and cooling rate of 0.5° C./minute,
 a first clad layer 72 of n-$Ga_{1-x}Al_xAs$ of 0.2 μm thickness at the horizontal part formed by a growth period of 20 seconds,
 a non doped active layer 73 of $Ga_{1-y}Al_yAs$ of 0.1 μm at the horizontal part formed by a growth period of 1 second,
 a second clad layer 74 of 1.5 μm thick p-$Ga_{1-x}Al_xAs$ by a growth period of 1.5 minutes, and
 an electrode contacting layer 75 of 1 μm thick p+-GaAs by a growth period of 1.5 minutes.
In the epitaxial growth, the thicker part and thinner parts of the active layers are 1 μm and 0.12 μm, respectively.

Thirdly, a 3000 Å thick $SiO_2$ film 76 is formed on the electrode contacting layer 75 by a known method, and stripe shaped opening 761 of 5 μm width is formed over an oblique part of the active layer 73 formed over the foot part of the step T, as shown in FIG. 8(c).

Fourthly, after diffusing zinc onto the exposed surface of the electrode contacting layer 75 through the opening 761, an ohmic contact electrode 77 is formed by sequential sputtering of Ti and Pt followed by vacuum deposition of Au.

Also, after lapping and subsequent chemical etching of the bottom face of the substrate 71, to control thickness of the substrate another ohmic contact electrode 78 is formed on the bottom face of the substrate 71 by vacuum deposition of a known alloy of Au-Ge-Ni, thus making the device shown in FIG. 8(c).

A number of lasers made continuously in lines and rows in a wafer are then divided into individual pieces, and the electrode 77 is heat-bonded to a heat sink and gold wire is bonded to the electrode 78.

The GaAs-Ga$_{1-x}$Al$_x$As semiconductor laser manufactured by the abovementioned process performs a satisfactory operation of stable continous lasing of fundamental mode at room temperature. And the transverse mode remains stable even for operations at a current as large as 5 times of the threshold value of the laser.

A modification of the laser of this example is made by replacing the SiO$_2$ films 76, 76 by high resistivity layers on the semiconductor substrate having a terrace section.

EXAMPLE 6

Figure 9A:
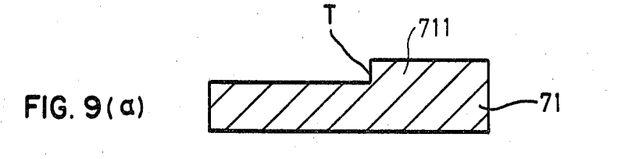
FIG. 9(a), FIG. 9(b), and FIG. 9(c) are schematic sectional elevation views of various steps of making of a sixth example of semiconductor laser in accordance with the present invention.
Figure 9B:
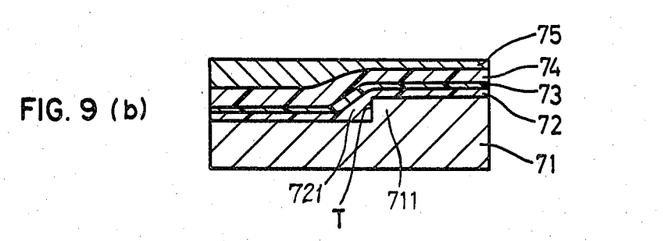
Figure 9C:
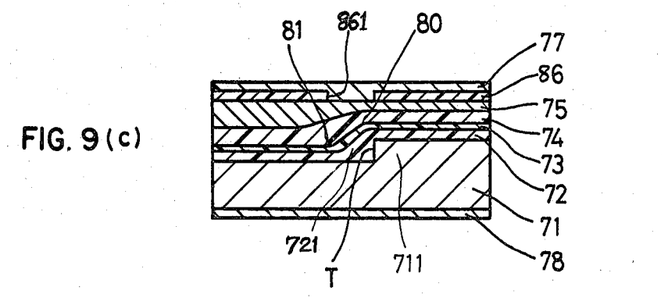

Example 6 shown in FIG. 9 is elucidated hereafter:

Firstly, a terrace 711 is formed on a principal face of a substrate 71 of n-type conductivity by, for example, etching a half part of the principal face to form a step T, as shown in FIG. 9(a).

Secondly, as shown in FIG. 9(b), the following layers are formed in sequence by liquid phase epitaxial growing:

on the substrate 71 of n$^+$-type conductivity:
    a thin first clad layer 72 of n-type conductivity
    an active layer 73 of non doping,
    a second clad layer 74 of p-type conductivity, and p1
    an electrode contacting layer 75 of p$^+$-type conductivity.

In the abovementioned sequential epitaxial growths, a thick part 721 is formed at the foot of the step T in the first clad layer 72.

Thirdly, a current limiting layer 86 of n-type conductivity is formed on all the face of the electrode contacting layer 75, and then, and an etching mask (not shown) is formed. And the etching mask is etched so as to form a stripe shape opening, from which a part of the surface of the electrode contacting layer 75, is exposed. Then by utilizing the etching mask the current limiting layer 86 is etched by known photoetching method, thus forming a stripe shape current injecting opening 861 over the thick part 721, as shown in FIG. 9(c). The width of the stripe shape current injecting opening 861 is preferably under 10 μm in order to desirably limit the dispersion of the current.

Fourthly, after diffusing an impurity, such as zinc, for ohmic contact onto the exposed surface of the electrode contacting layer 75 through the openings of the etching mask and of the current limiting layer 861, an ohmic contact electrode 77 is formed on the exposed surface of the electrode contacting layer 75 as well as on the surface of the insulating film 86. And, another ohmic contact electrode 78 is formed on the bottom face of the n$^+$-type substrate 71 as shown in FIG. 7(c).

For the semiconductor substances of the abovementioned example, for example, the followings can be used:

(1) Ga$_{1-y}$Al$_y$As for the active layer and Ga$_{1-x}$Al$_x$As for the clad layers ($0 \leq y < x < 1$).
(2) InGaAsP for the active layer an InP for the clad layers.
(3) GaInAs for the active layer and GaInP for the clad layers.
(4) GaAlAsSb for the active layer and GaAlAs for the clad layers.

In general, when an epitaxial growth layer is formed on a substrate having a terrace part, at an initial stage of the epitaxial growth the growth speed of the concave corner part, i.e., of the part at the foot of the step of the terrace is greater than that of other parts, and this phenomena is dominant especially in the first grown layer, i.e., first clad layer 72. Accordingly, by selecting the growth condition, it is possible that the first clad layer 72 has a thick part 721 which is around the step and sufficiently thick for preventing light absorption by the substrate 71 and a thinner parts which are far from the step part and sufficiently thin for allowing absorption of light into the substrate 71 therethrough.

When the laser of this example is a GaAs-GaAlAs laser and the first clad layer 72 is an n-type Ga$_{0.7}$Al$_{0.3}$As, the light absorption coefficients for several thicknesses of the first clad layer is follows:

1 μm thick: 10 cm$^{-1}$
0.5 μm thick: 100 cm$^{-1}$
0.3 μm thick: 300 cm$^{-1}$
0.2 μm thick: 1000 cm$^{-1}$.

Therefore, by making the thickness of the thick part 721 to be over 1 μm, the absorption of light in the oblique part of the active layer 73 through the thick part 721 into the substrate 71 is substantially prevented. Also, by making the far away thin part to be under 0.5 μm, the light in the far away part (horizontal part of the active layer 73) is considerably absorbed through the thin part of the first clad layer 72 into the substrate.

Furthermore, the first clad layer 72 forms a bent face consisting of an upper horizontal part, a lower horizontal part and a narrow striped shaped oblique part inbetween as shown in FIG. 9(c). Accordingly, the thin active layer 73 formed on the bent face of the first clad layer 72 has a similar bent configuration, and hence two bent parts 80 and 81 on both sides of its stripe shape oblique part. Such bent parts on both parts of the oblique part of the active layer 73 serves to prevent light from leaking therethrough. Therefore, the oblique part between the pair of bent parts 80 and 81 is optically isolated from the horizontal parts, thereby having a different lasing mode from the latter. Accordingly, a fundamental mode lasing is produced in the oblique part of the active layer 73.

Furthermore, it is confirmed that the thickness of the active layer 73 becomes 10 to 20% thicker at the oblique part which is between the bent parts 80 and 81 in comparison with other parts (i.e., horizontal parts) of the active layer 73. Therefore, the active layer 73 forms a rib shape waveguide configuration and the lased light is confined in the oblique part between the two bent parts 80 and 81. The difference of effective refractive indexes of light of the thicker part and the thinner part of the active layer 73 is of the order of 10$^{-3}$. In order to obtain a lasing in TE$_{OO}$ mode for such value of the difference, it is required that the width of the lasing region is preferably under 3 μm. For the width of about 5 μm, there is a possibility of lasing in TE$_{01}$ mode. However, in the construction of FIG. 9(c), since the thickness of the active layer continuously decreases as a position departs from the center of the oblique part of the active region, the light absorption by the substrate becomes large as the position departs from the center. Accordingly, the mode of lasing becomes fundamental at or around the center. Therefore, the present laser can perform a stable fundamental mode of lasing.

The laser of the FIG. 9(c) has a satisfactory heat radiation characteristic due to its employment of semiconductor current limiting layer 86.

The laser of the example of FIG. 9(c) does not have the abovementioned shortcomings of the conventional lasers of FIG. 1 to FIG. 3. And furthermore, the laser of the example of FIG. 9(c) has simpler manufacturing process than the conventional laser, since the epitaxial growth process can be made in one sequence.

An example of making a laser of FIG. 9(c) where the active layer is of GaAs and the clad layers are of $Ga_{1-x}Al_xAs$ is as follows:

Firstly, on a principal face of a (100) plane of an $n^+$—GaAs substrate 71, a terrace is formed by selective chemical etching in a manner that the vertical plane of the step T of about 2 μm of the terrace is vertical to a (110) plane, i.e., a cleavage plane, thereby forming the substrate of FIG. 9(a).

Secondly, on the substrate 71, the following layers are formed as shown in FIG. 9(b), by a sequential liquid phase epitaxial growth of starting temperature of 845° C. and cooling rate of 0.5° C./minute, a first clad layer 72 of n-$Ga_{1-x}Al_xAs$ of 0.2 μm thickness at the horizontal part formed by a growth period of 20 seconds, a non doped active layer 73 of $Ga_{1-y}Al_yAs$ of 0.1 μm at the horizontal part formed by a growth period of 1 second, a second clad layer 74 of 1.5 μm thick p-$Ga_{1-x}Al_xAs$ by a growth period of 1.5 minutes, an electrode contacting layer 75 of 1 μm thick $p^+$-GaAs by a growth period of 1.5 minutes and a current limiting layer 86 of 1 μm thick n-$Ga_{1-z}Al_zAs$ by a growth period of 1.5 minutes ($0 \leq y < x < 1$, $0 \leq z < x < 1$).

In the epitaxial growth, the thicker part and thinner parts of the first clad layers 72 are 1 μm and 0.12 μm thick, respectively, and the thicker part of the active layer 73 is about 0.2 μm thick, the width between two parallel bents 80 and 81 of the active layer 72 is about 6–7 μm and the cavity length is 250 μm.

Thirdly, a 3000 Å thick $SiO_2$ film 76 is formed on the electrode contacting layer 75 by a known method, and stripe shaped opening 761 of 11 μm width is formed over an oblique part of the active layer 73 formed over the foot part of the step T, as shown in FIG. 9(c).

Fourthly, after diffusing zinc onto the exposed surface of the electrode contacting layer 75 through the opening 761, an ohmic contact electrode 77 is formed by sequential sputtering of Ti and Pt followed by vacuum deposition of Au and alloying of them. Also, after lapping and subsequent chemical etching of the bottom face of the substrate 71 to control thickness of the substrate, another ohmic contact electrode 78 is formed on the bottom face of the substrate 71 by vacuum deposition of a known alloy of Au-Ge-Ni, thus making the device shown in FIG. 9(c).

A number of lasers made continuously in lines and rows in a wafer are then divided into individual pieces, and the electrode 77 is heat-bonded to a heat sink and gold wire is bonded to the electrode 78.

The GaAs-$Ga_{1-x}Al_xAs$ semiconductor laser of FIG. 9(c) manufactured by the abovementioned process performs a satisfactory operation of stable continuous lasing of fundamental mode at room temperature. And the transverse mode remains stable even for operations at a current as large as 5 times of the threshold value of the laser.

Figure 10:
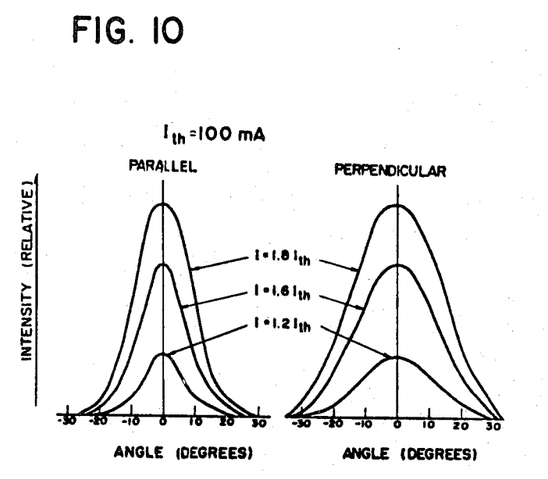
FIG. 10 is a graph showing far field intensity distributions.

FIG. 10 is a graph showing "far field intensity distributions" of the laser of FIG. 9. The left curves are for distributions in a plane of the junction between the first clad layer 72 and the active layer 73 and the right curves are for distributions in a plane perpendicular to the abovementioned junction plane and at the center of the oblique part of the active layer 73.

Figure 11A:
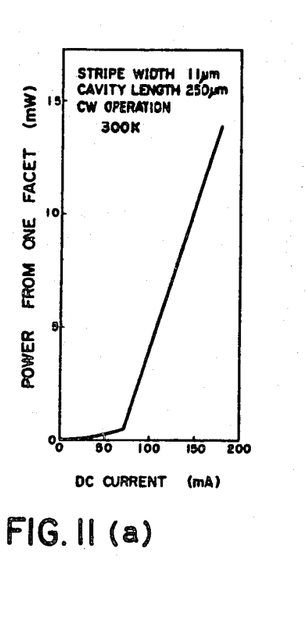
FIG. 11(a) and FIG. 11(b) are graphs of relations between the injection current and output power intensity, respectively.
Figure 11B:
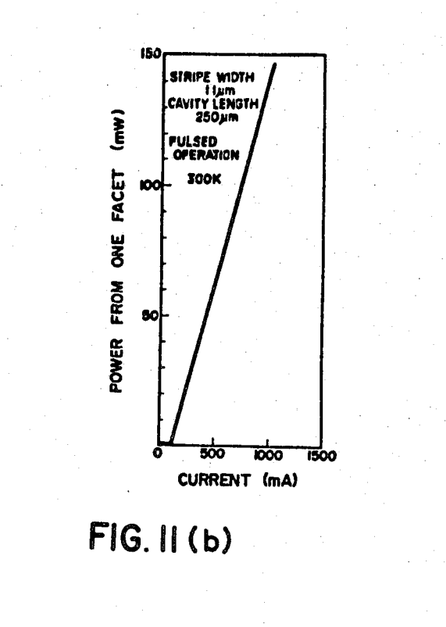
Figure 12:
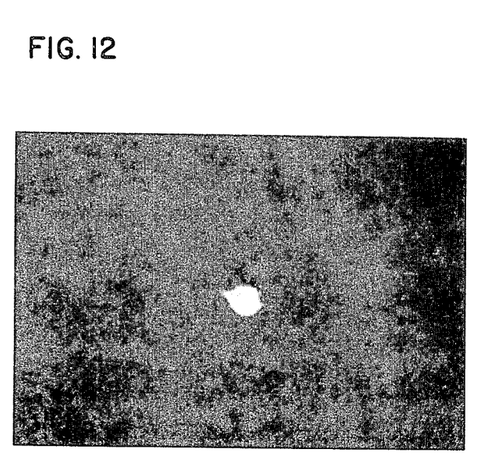
FIG. 12 is a front view photograph of the laser in operation of FIG. 9.

Characteristics of the laser of FIG. 9 is shown by FIGS. 10 to 12. As shown in FIG. 10, the distribution pattern does not change even when the injected current is changed in a wide range. In other words, even for increased injection current, the mode of lasing does not split, and a fundamental mode remains stable. (If the lased mode splits, the curves of the far field intensity distribution vary to have plural peaks.)

FIG. 11(a) and FIG. 11(b) are graphs showing relations between the injection current and output power intensity for DC operation and Pulse current operation of the laser of FIG. 9. As shown in these graphs, there is no kink phenomenon (the phenomenon that the increase of the output with respect to the current increase stops at a certain value of current) on the curves, and a good linearity of injection current vs. output response and a stable lasing mode is obtainable. As shown in FIG. 11, by means of a pulse operation, a large injection current can be put in. In the curves, a low gradient parts at the low injection part shows ranges of spontaneous emission (non coherent emission).

FIG. 12 is a front views photograph of the laser FIG. 9 in operation. The photograph shows that the laser is operating in a fundamental mode (with a single light beam) in the oblique part of the active layer 73.

From the description for the abovementioned several examples, it becomes clear that the laser of the present invention has the following principal advantages:

The first clad layer which is between the semiconductor substrate and the active layer has a triangular thicker part at the foot part of the terrace step and horizontal thinner parts on the raised plane face on the terrace and on the lower plane face. Accordingly, the lights in the parts of active layer of the thinner parts of the first clad layer are absorbed through the thinner parts by the substrate, while the light in the part of active layer on the thicker parts of the first clad layer is prevented from leaking to the substrate by the thicker part. Therefore, only the fundamental lasing mode in the part of the active layer on the thicker part is retained.

The active layer has a narrow stripe shaped oblique part between a pair of parallel bents. The oblique part is 10 to 20% thicker than horizontal thinner parts connecting thereto. The thicker part of the active layer forms a kind of rib shaped waveguide, which together with the parallel bends confines the light in the thicker part of the active layer.

From the description for the abovementioned several examples, it becomes clear that making method in accordance with the present invention has the following principal advantages:

The making method utilizes only one epitaxial growth, and therefore, there is neither problem of contamination of the active layer and resultant crystal imperfection of the active layer, nor need of delicate control of etching to make a rib part.

What we claim is:

1. In a semiconductor laser of multi-layer heterostructure, an active layer epitaxially formed on a cladding layer on a substrate, a first ohmic contact electrode which is stripe shaped and disposed above said active layer, and a second ohmic contact electrode disposed under and contacting said substrate, said substrate having a terraced structure with a step part on its principle face, said active layer having a stripe shaped active region disposed oblique to said principle face between upper and lower parts which are horizontal to said principle face, with upper and lower bent parts disposed respectively between.

2. A semiconductor laser in accordance with claim 1, wherein
said substrate has a terraced structure with a step part on its principal face,
said active region is disposed above said step part.

3. A semiconductor laser in accordance with claim 1, wherein,
said first ohmic contact electrode is formed in a stripe shaped opening formed in an insulating film.

4. A semiconductor laser in accordance with claim 2 wherein,
said first ohmic contact electrode is formed in a stripe shaped opening formed in an insulating film.

5. A semiconductor laser in accordance with claim 1 wherein,
said first ohmic contact electrode is a metal film formed on all the face of a hetero isolation layer which has a stripe shaped opening and has the same conductivity as that of said substrate.

6. A semiconductor laser in accordance with claim 2 wherein,
said first ohmic contact electrode is a metal film formed on all the face of a hetero isolation layer which has a stripe shaped opening and has the same conductivity as that of said substrate.

7. A semiconductor laser in accordance with either of claim 2 or 6 wherein,
a layer of the opposite conductivity type to that of the substrate is formed on the surface of the substrate except a part at the foot of said step part.

8. A semiconductor laser in accordance with either of claim 2 or 6 wherein,
a high resistivity layer is formed on the surface of the substrate except a part at the foot of said step part.

9. A semiconductor laser in accordance with either one of claims 2 through 6 wherein, said active region is thicker than the other parts of said active layer.

10. A semiconductor laser in accordance with either one of claims 2 through 6 wherein said clad layer has a thicker part on said step part of a thickness larger than thicknesses of other parts of said clad layer, said active region being disposed on said thicker part.

* * * * *